United States Patent [19]

Angelucci

[11] Patent Number: 4,841,231
[45] Date of Patent: Jun. 20, 1989

[54] TEST PROBE ACCESSIBILITY METHOD AND TOOL

[75] Inventor: Ernest A. Angelucci, Kennett Square, Pa.

[73] Assignee: Unisys Corporation, Blue Bell, Pa.

[21] Appl. No.: 114,918

[22] Filed: Oct. 30, 1987

[51] Int. Cl.$^4$ .................. G01R 1/04; G01R 31/02
[52] U.S. Cl. .................... 324/73 R; 324/72.5; 324/149; 324/158 F; 324/158 P
[58] Field of Search ............... 324/158 F, 158 P, 72.5, 324/73 PC, 73 R, 149

[56] References Cited

U.S. PATENT DOCUMENTS

| | | | |
|---|---|---|---|
| 3,870,953 | 3/1975 | Boatman et al. | 324/73 R |
| 4,055,806 | 10/1977 | Patel | 324/73 R |
| 4,242,633 | 12/1980 | Tissot | 324/73 R |
| 4,328,264 | 5/1982 | Johns et al. | 324/158 P |
| 4,348,636 | 9/1982 | Soundoulakis | 324/73 R |
| 4,621,232 | 11/1986 | Chang et al. | 324/158 R |

OTHER PUBLICATIONS

"Contact Probe Assembly with a Retractable Shorting Center", by Faure, *IBM Tech. Disc. Bull.*, vol. 19, #4, 9/76, pp. 1267-1268.

*Primary Examiner*—Reinhard J. Eisenzopf
*Assistant Examiner*—W. Burns
*Attorney, Agent, or Firm*—Albert B. Cooper

[57] ABSTRACT

A method and tool for use with "bed of nails" fixturized automatic test equipment for printed circuit cards for verifying the continuity of component pins with the test nails of the system where the pins of the component are not accessible from the component side of the card. A tool is affixed beneath the component to short out all of the pins thereof and a node accessible from the component side of the board that makes contact with one or more of the pins of the component (such as power or ground) is probed with the continuity probe of the system while a continuity test is performed with respect to each of the test nails associated with the pins and nodes of the component.

7 Claims, 4 Drawing Sheets

TEST PROBE ACCESSIBILITY METHOD AND TOOL

BACKGROUND OF THE INVENTION

1. Field of the Invention

The invention relates to automatic test equipment (ATE) for printed circuit card assemblies particularly with respect to systems utilizing bed-of-nails fixturization.

2. Description of the Prior Art

Automatic test equipment utilizing bed-of-nails fixturization for testing printed circuit card assemblies are well known in the prior art. In such systems the printed circuit card is inserted into a fixture having a plurality of test probes or "nails" adapted to contact the electrical nodes of the card from the solder side thereof. The plurality of test probes resemble a "bed of nails". The fixture includes a vacuum port utilized to create a vacuum between the card and the probes so as to urge the card into effective electrical contact with the probes. Such test systems typically utilize one probe for each node of the printed circuit card under test. The system also conventionally includes one driver/sensor for each probe. The driver stimulates a probe with test signals and the sensor senses the response of the node contacted by the probe. In this manner the various components on the card can be tested by the test programs incorporated in the ATE. The test programs apply appropriate stimulation via the drivers and examine the appropriate outputs via the sensors.

In this manner the system automatically detects faults on the card and identifies the suspected faulty components and further identifies the pins of the components that may be involved in the faults. Conventionally, in the process of isolating a fault, the existance of continuity between the pins of a suspected component and the system driver/sensors is first verified. If such continuity is detected, the component is declared by the system to contain a fault and appropriate action is effected. In such ATE systems, the continuity test is performed with a hand-held probe coupled to the system. The probe is utilized to sequentially contact, from the component side of the card, each of the pins of the suspected component while the system, via the bed-of-nails probes, performs the continuity test. If an open is detected between the test system and the suspected component on the card, the component is considered to be good and appropriate further action is taken. Before a defective component is replaced, involving expensive card rework, the continuity test is utilized to guarantee that the suspected component is, in fact, defective.

This continuity verification test is effectively utilized with all types of components having pins that are physically accessible to the probe on the component side of the card. Such components include discrete elements such as resistors, capacitors, and the like as well as dual-in-line (DIP) packages having pin shoulders on the accessible side of the card.

Present day printed circuit card assemblies utilize large numbers of pin-grid or gate arrays (PGA). The pins of the PGA package emanate from the bottom thereof and thus accessibility to the pins of a PGA from the component side of the card by the hand held continuity probe is practically impossible. In the absence of performing the continuity test on a suspected PGA, the procedure utilized may be simply to replace the component. For a significant number of detected PGA faults, the problem may be lack of continuity with the test system rather than a faulty component. Present day PGA's are expensive ($100-$400) and there are many such components (40 or so) on each card. Thus, replacement of nonfaulty PGA's involves a significant expense not only in the cost of the devices themselves but in the time and labor expended in performing the replacements in addition to the various product reliability problems that are often associated with rework.

As an alternative to replacing the suspected PGA, the card may be removed from the fixture and a portable continuity tester, such as an ohmeter, utilized to trace the continuity of the networks with which the suspected PGA is associated. Since the card has been removed from the fixture, contact with the solder side thereof may be effected. This approach is undesirable because it involves a lengthy manual intervention in an otherwise rapid automatic test process. This is appreciated since present day PGA packages include between 70 to 250 pins that connect to a like number of networks on the card.

Another prior art solution of the problem is the utilization of a separate test system that semiautomatically meters the networks of a card that failed the ATE test. Utilization of such systems require removing the card from the ATE fixture, taking the card to the secondary system, inserting the card into the secondary system, and performing the test thereon This procedure considerably extends the testing time required for the card. Such ancillary systems add excessive cost to the card testing process particularly considering the fixturization to adapt the ancillary system to the numerous cards to be tested.

SUMMARY OF THE INVENTION

The above described disadvantages of the prior art are obviated by a method in which a tool is inserted between the solder side of the card under test and the probes of the bed-of-nails fixture beneath the suspected PGA to temporarily short all of the pins thereof so that any easily accessible node, such as power or ground, can be probed from the component side of the card by the hand-held continuity probe. In this manner continuity of the PGA pins with respect to the test system can be indirectly verified.

DESCRIPTION OF THE PREFERRED EMBODIMENT

Figure 1:
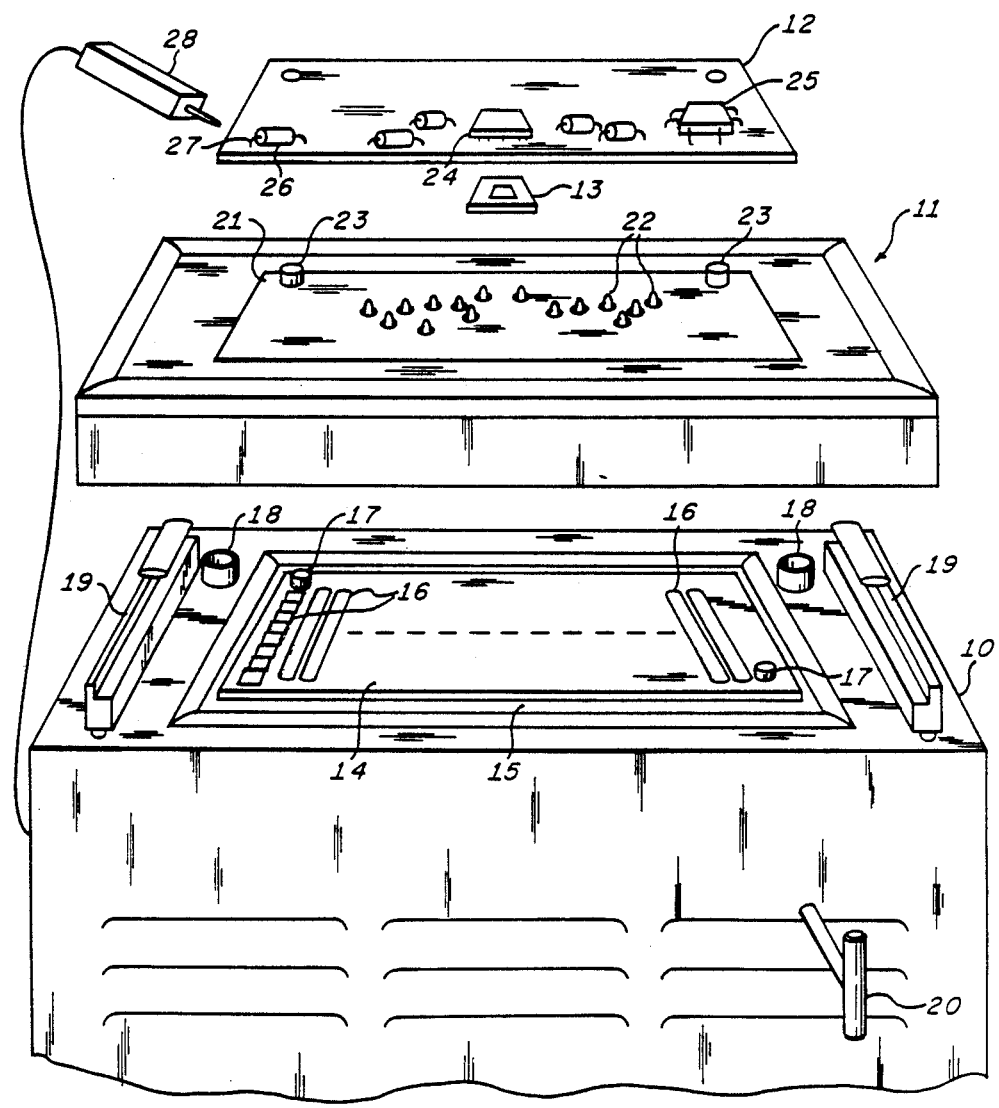
FIG. 1 is an exploded perspective view of an ATE system with the tool of the present invention positioned for use.

Referring to FIG. 1, the physical layout of an ATE system including a receiver console 10 with an associated test fixture 11 and a printed circuit card unit under test is illustrated. Shown interposed between the printed circuit card 12 and the test fixture 11 is the tool 13 of the present invention for reasons to be discussed. The receiver console 10 contains the microprocessors, software, electronics and circuitry for generating, controlling, and performing the ATE tests as well as for analyzing the results thereof. The receiver console 10 includes a receiver 14 sealed in the receiver console 10 by a receiver gasket 15. The receiver 14 includes a plurality of connector positions 16. The connector positions 16 comprise multi-pin connectors for providing the test signals from the ATE receiver console 10 to the test fixture 11 and for receiving the results of the test stimulation signals therefrom.

Disposed on the receiver 14 are locating pins 17 for aligning the test fixture 11 such that connectors (not shown) on the bottom thereof appropriately mate with the connector positions 16. The receiver console 10 includes vacuum ports 18 for creating a vacuum within the test fixture 11 such that the unit under test 12 is urged into contact with the "bed of nails" test probes. The receiver gasket 15 is effective in providing a vacuum seal for this purpose. The receiver console 10 includes test fixture lifter bars 19 as well as a fixture lifter handle 20. By pulling the handle 20 outwardly from the console 10 and twisting the handle clockwise or counterclockwise, the lifter bars 19 are actuated to lift the test fixture 11 thereby breaking the vacuum seal. The handle 20 is utilized when removing the fixture 11 from the console 10.

The test fixture 11 comprises a "bed of nails" 21 comprising a plurality of test nails or probes 22. The nails 22 are positioned in the bed of nails 21 so as to provide contacts to all of the nodes and test points on the solder side of the printed circuit card 12. The nails 22 are spring loaded to provide good electrical contact. It is appreciated that different arrangements of the nails 22 are utilized for the different types of printed circuit cards to be tested by the system. The nails 22 are electrically connected to multi-pin connectors (not shown) at the bottom of the test fixture 11 to mate with the connection positions 16 of the receiver 14. In this manner, appropriate test connections are made to the solder side of the card 12. The test fixture 11 includes alignment pins 23 for aligning the position of the unit under test 12 with the bed of nails 21.

For purposes of discussion, the card 12 is illustrated including a PGA 24, a DIP 25 and discrete components such as a component 26. It is appreciated that the pins of tee DIP 25 as well as the pins of the component 26 are accessible on the component side of the board whereas the pins of the PGA 24 are not so accessible. It is appreciated that access may be had to the pins of the DIP 25 and the component 26 at the shoulders of the component leads. It is further appreciated that pins of the PGA 24 such as power or ground may be connected to the same power or ground printed circuit card trace as, for example, pin 27 of the component 26.

In operation of the receiver console 10 of the ATE, the test fixture 11 is placed on the receiver 14 aligned by the locating pins 17 and the card 12 to be tested is placed on the bed of nails 21 aligned by the aligning pins 23. With vacuum applied to the vacuum ports 18, the card 12 is urged toward the bed of nails 21 to effect electrical contact with the test nails. The microprocessors within the receiver console 10 effect a complete test of the card 12 including functional digital tests as well as pin-to-pin electrical continuity and short tests.

The ATE also includes a hand held continuity test probe 28 electrically connected to the equipment in the receiver console 10. The test program of the ATE may select any test nail on which to perform a continuity test. The probe 28 is placed in contact with the lead of the component on the component side of the card 12 that is presumed to be making electrical contact with the nail. The ATE determines if continuity exists. For example, if the automatic test indicates a failure with respect to the DIP 25, continuity of the pins of the DIP 25 to the receiver 14 is verified by sequentially touching each of the pin shoulders with the probe 28 while the ATE sequences through the respective nails associated therewith.

If the PGA 24 fails the automatic test, the pins thereof are not accessible to the probe 28 from the component side of the card 12 to verify continuity of the pins to the test system. In accordance with the invention, the card 12 is removed from the system and the tool 13 affixed to the solder side of the card 12 underneath the PGA 24 shorting all of the pins thereof. The card 12 is reinserted in the test fixture 11 and the probe 28 is positioned to contact any accessible point on the component side of the card 12 (such as a power or ground pin) that will connect to a pin of the PGA 24. For example, if the pin 27 is a ground point, the probe 28 may be placed in contact therewith. After contact is effected, the probe 28, the nails associated with the pins of the PGA 24 are sequenced through the continuity test. If one of these test paths is open, the condition is detected by such use of the tool 13. It is appreciated that any exposed pin on the component side of the card 12 may be utilized by the probe 28 if that pin connects with the PGA 24. During the automatic test of the PGA 24, the software of the ATE expects to make contact to every pin of the array. If instead an open is detected, use of the tool 13 indirectly verifies the continuity of the PGA pins to the test system.

Figure 2:
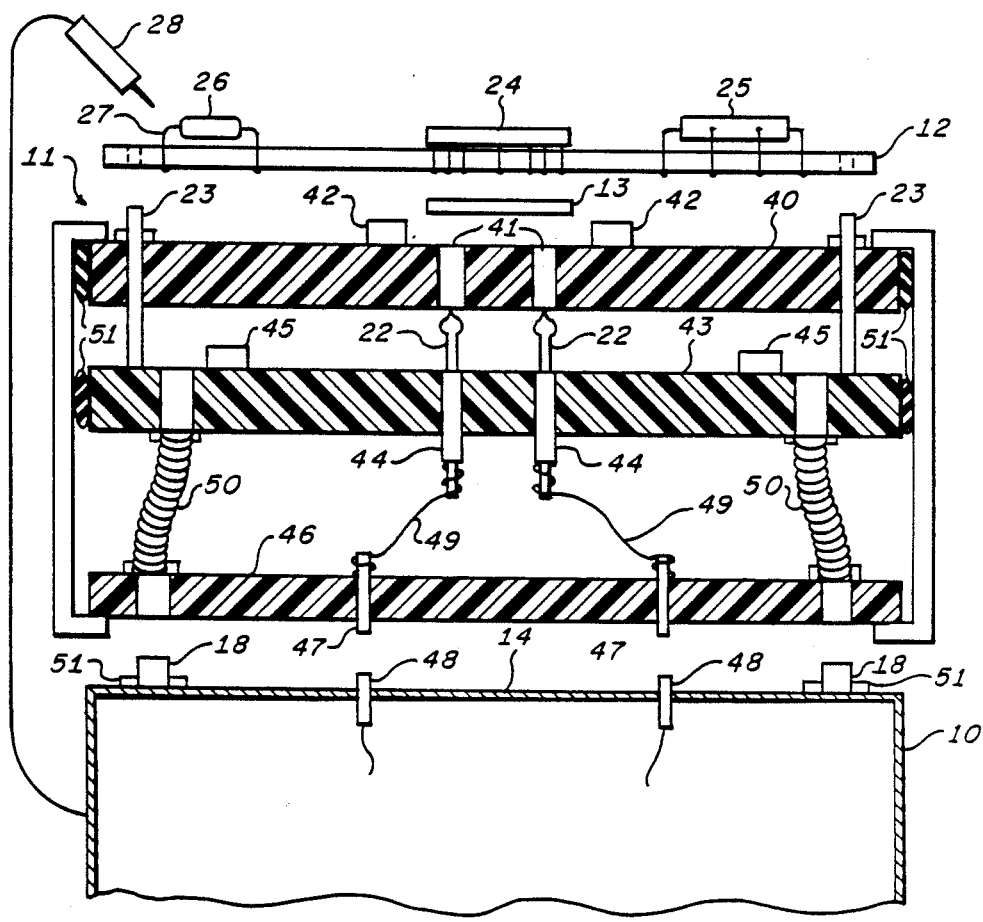
FIG. 2 is a sectional elevation view of the ATE system of FIG. 1 illustrating internal details of the test fixture thereof.

Referring to FIG. 2, in which like reference numerals indicate like components with respect to FIG. 1, a detailed sectional view of the test fixture 11 is illustrated. The test fixture 11 includes a diaphragm board 40 disposed for vertical motion along the alignment pins 23. The diaphragm board 40 includes apertures 41 through which the test nails 22 may protrude to effect contact with t e nodes or test points on the solder side of the card 12. Card supports 42 are mounted on the diaphragm board 40 to support the card 12 when inserted in the ATE under vacuum.

The test fixture 11 includes a baseboard 43 in which nail sockets 44 are mounted. The nails 22 are slidably disposed in the nail sockets 44 for vertical motion therein. The nails 22 are spring loaded within the sockets 44 so that they are urged upwardly to provide effective contact with the nodes of the card 12. Mounted on the baseboard 43 are stops 45 for limiting the downward motion of the diaphragm board 40.

The test fixture 11 has a bottom board 46 that includes electrical connectors for providing electrical contact between the connector positions 16 (FIG. 1) of the receiver 14 and the nails 22. For illustrative purposes, two mating contact pins 47 are shown in the board 46. Two corresponding receiver contact pins are illustrated at 48. Wiring is run from the receiver contact pins 48 to the ATE test system. Wiring 49 in the test fixture 11 effects the appropriate electrical paths between the contact pins 47 and the nail sockets 44. The wiring 49 is connected to effect test paths between the receiver console 10 and the unit under test 12 in accordance with the circuitry of the unit 12 and the tests to be performed.

When the ATE performs the automatic test on the card 12, the tool 13 is not interposed as illustrated. The test fixture 11 is positioned on the receiver 14 with the vacuum ports 18 having access to the upper interior of the fixture 11 via flexible vacuum hoses 50. The card 12 is placed on the diaphragm board 40 aligned by the alignment pins 23. Vacuum is pulled generating an actuating force on the card 12 and the diaphragm board 40. The card 12 is urged downwardly against the diaphragm board 40 which is pulled downwardly by the vacuum until contacting the stops 45. The test nails 22 protruding through the apertures 41 effect contact to the numerous test nodes on the solder side of the card 12. If the PGA 24 fails the automatic test, the vacuum is broken and the cord 12 removed so as to affix the tool 13 beneath the PGA 24 to short all of the pins thereof with respect to each other. The board 12 with the tool 13 affixed thereto is repositioned on the test fixture 11 and the continuity test described above is performed with probe 28 after vacuum is again re-established. It is appreciated that appropriate vacuum seals 51 are included in the test fixture 11 and on the console 10 so that the operations described can be effected. In the preferred ATE system utilized, two independent vacuum systems and controls are included. One system secures the fixture 11 to the console 10 and is controlled by the handle 20 (FIG. 1). The second system is controlled by the ATE program to urge the unit under test 12 toward the fixture 11 via the vacuum ports 18.

Figure 3A:
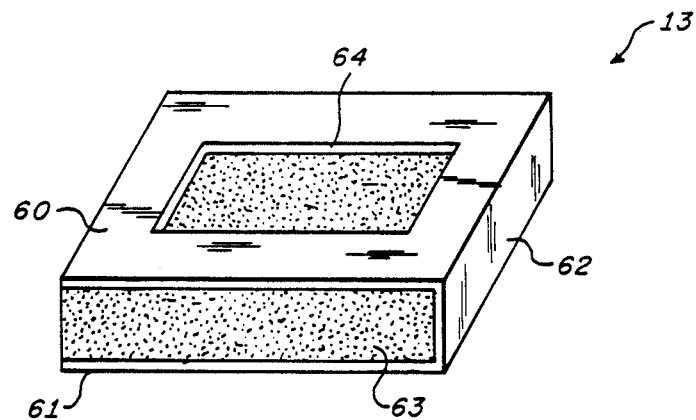
FIG. 3A is an isometric view of the test probe accessibility tool of the present invention.

Referring to FIG. 3A, a preferred embodiment of the tool 13 of the present invention is illustrated. The tool 13 is comprised of two plates 60 and 61 of flexible metal foil electrically connected by an edge 62 and held together with a piece of double sided tape 63. The tape 63 may, for example, comprise double sided foam tape. An aperture 64 in the top foil plate 60 exposes the adhesive of the foam tape 63. The tool 13 can thereby be fastened to the solder side of the card under test 12 underneath the suspected PGA 24 so that the metal plate 60 provides an electrical short with respect to all of the pins of the PGA.

The tool 13 can be configured to accommodate any intergrated circuit package type and can thus be utilized in any ATE configuration having bed of nails fixturization where probe accessibility is a problem. The tool 13 is relatively inexpensive, and since use of the tool will eliminate the requirement to remove PGAs from printed circuit cards before a failure has been isolated, the present invention provides substantial savings in both parts and labor as well as an increase in reliability for a wide range of products.

Figure 3B:
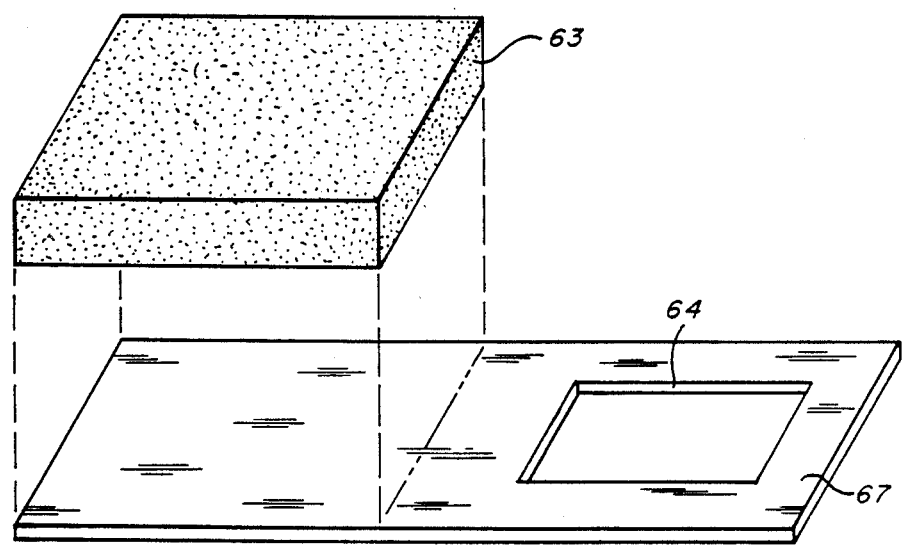
FIG. 3B is an exploded view of the tool of FIG. 3A.

FIG. 3B illustrates an exploded view of the tool 13 of FIG. 3A. It is appreciated that, conveniently, the top foil plate 60 with the aperture 64, the bottom foil plate 61 and the edge 62 may be fabricated from a single strip of metallic foil 67. It is further appreciated that the tool 13 may have any convenient configuration that will permit affixation to the card 12 under a suspected package so that the pins of the package are all shorted with respect to each other. Additionally, the tool 13 provides electrical contact for the test nails associated with the test point nodes of the PGA. For example, a metal plate having a shape similar to the plate 60 with adhesive in the center thereof may also be utilized to the same effect. This plate may affixed underneath the suspected PGA so that the upper surface of the plate shorts out all of the pins of the PGA and the bottom surface thereof provides electrical contact for the associated test nails.

Figure 4:
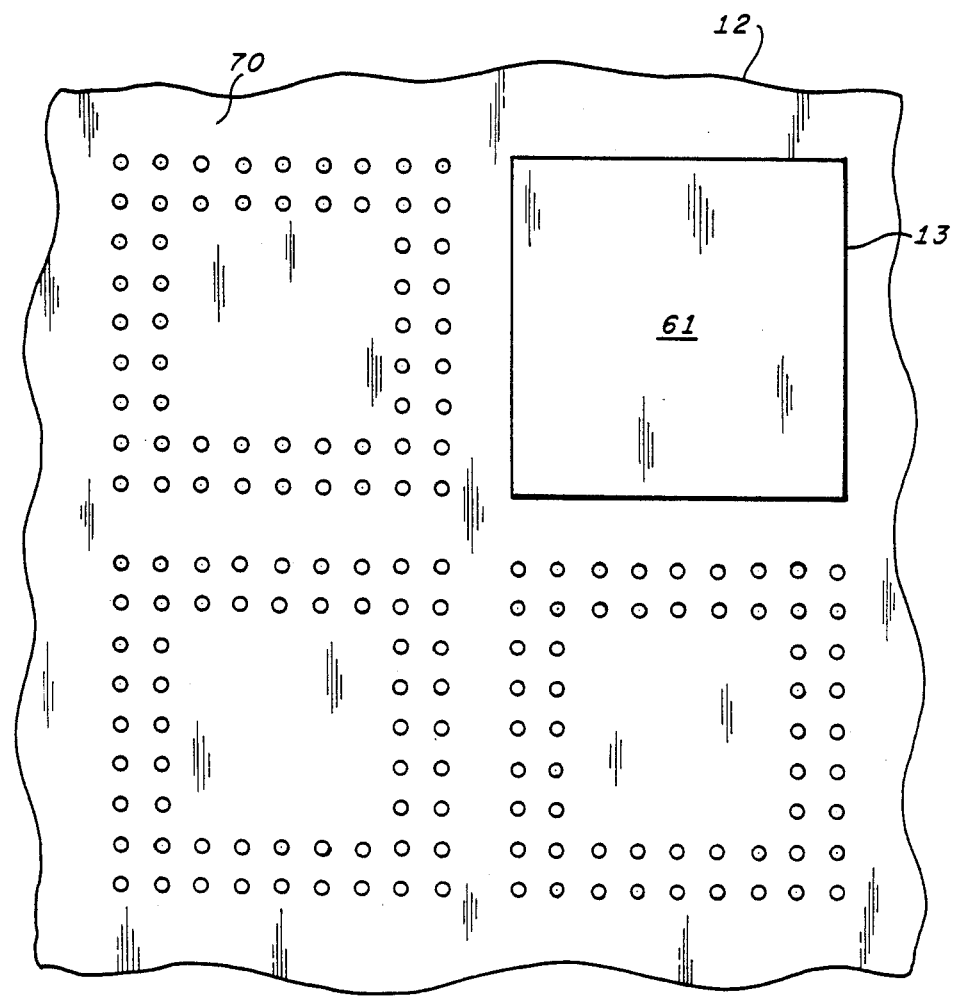
FIG. 4 is a view of a portion of the solder side of a printed circuit card under test with the tool of FIG. 3A affixed thereto.

Referring to FIG. 4, a bottom view of a section of the printed circuit card 12 is illustrated containing four PGAs. This section of the card 12 shows the solder side 70 thereof. The tool 13 is illustrated affixed underneath a suspected PGA shorting out all of the pins thereof. The bottom plate 61 of the tool 13 provides electrical contact for the test nails associated with the test point nodes of the PGA. The adhesive exposed through the aperture 64 (FIG. 3A) causes the tool 13 to adhere to the card 12 underneath the suspected PGA. It is appreciated that with the tool 13 affixed as illustrated in FIG. 4, and with the probe 28 (FIGS. 1 and 2) contacting a node (such as power or ground) on the component side of the board 12 that connects with a pin of the suspected PGA, continuity to all of the test nails underneath the suspected PGA may be verified. If continuity with the bed of nails is so verified, faults such as opens detected during the automatic test of the card 12 have been isolated to the card or the PGA and appropriate action may be effected. Failure of one or more of the test nails to indicate continuity during the continuity test with the tool 13 in place is an indication that the suspected PGA is in fact not defective.

The tool and method of the present invention may be readily adapted to any industry standard ATE utilizing the bed of nails fixture concept. Substantial savings in material and time may be effected in avoiding card rework and expensive ancillary systems by utilizing the present invention.

Although the preferred embodiment of the invention has been described in terms of PGAs, it is appreciated that the invention may be utilized to overcome a pin inaccessibility problem with any type of component.

While the invention has been described in its preferred embodiment, it is to be understood that the words which have been used are words of description rather than limitation and that changes may be made within the purview of the appended claims without departing from the true scope and spirit of the invention in its broader aspects.

I claim:

1. A method for verifying continuity between the pins of a potentially faulty component on a circuit card and the associated probes of an automatic test system where said pins are not accessible from the component side of the card and said probes are electrically isolated with respect to each other, each said probe providing a distinct electrical path to said automatic test system, comprising the steps of:
   shorting said pins of said component with respect to each other by shorting means,
   probing a point of said card on said component side thereof with a continuity probe of said system, where said point is in electrical contact through other than said shorting means with at least one of said pins of said component, and
   performing a separate respective continuity test with respect to each of said associated probes using said continuity probe and said automatic test system, said continuity probe being in contact with said point for each said test.

2. The method of claim 1 in which said shorting step comprises affixing a tool on the solder side of said card underneath said component, said tool including said shorting means for shorting said pins of said component with respect to each other.

3. The method of claim 2 in which said shorting step comprises affixing said tool to the solder side of said card underneath said component, said tool including electrical contact means for contacting said associated probes of said automatic test system, said shorting means and said electrical contact means being electrically connected with respect to each other.

4. A tool for use in the method of claim 1 wherein said card has a component side and a solder side, comprising:

affixing means for affixing said tool to said solder side of said card underneath said potentially faulty component, and shorting means for electrically shorting said pins of said component with respect to each other.

5. The tool of claim 4 further including electrical contact means for providing electrical contact for said associated probes of said automatic test system, said electrical contact means being in electrical contact with said shorting means.

6. The tool of claim 5 wherein said shorting means and said electrical contact means comprise a single strip of metal foil folded around a piece of double sided adhesive tape forming first and second plates superposed with respect to each other, said first plate forming said shorting means and said second plate forming said electrical contact means, said first plate having an aperture therethrough exposing said adhesive tape so as to form said affixing means.

7. The tool of claim 6 wherein said double sided adhesive tape comprises double sided foam tape.

* * * * *